United States Patent
Choi et al.

(10) Patent No.: US 10,082,694 B2
(45) Date of Patent: Sep. 25, 2018

(54) DISPLAY DEVICE

(71) Applicant: Samsung Display Co., Ltd., Yongin-si, Gyeonggi-do (KR)

(72) Inventors: Nak Cho Choi, Hwaseong-si (KR); Su Wan Woo, Osan-si (KR); Suk Choi, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 16 days.

(21) Appl. No.: 15/208,449

(22) Filed: Jul. 12, 2016

(65) Prior Publication Data

US 2017/0045771 A1 Feb. 16, 2017

(30) Foreign Application Priority Data

Aug. 11, 2015 (KR) .................. 10-2015-0113267

(51) Int. Cl.
| | |
|---|---|
| H01L 51/52 | (2006.01) |
| G02F 1/1333 | (2006.01) |
| G02F 1/1368 | (2006.01) |
| G06F 3/0481 | (2013.01) |
| H01L 27/32 | (2006.01) |
| H01L 51/50 | (2006.01) |
| H01L 51/00 | (2006.01) |

(52) U.S. Cl.
CPC ...... *G02F 1/133377* (2013.01); *G02F 1/1368* (2013.01); *G02F 1/13336* (2013.01); *G06F 3/04817* (2013.01); *H01L 27/322* (2013.01); *H01L 27/3244* (2013.01); *H01L 27/3246* (2013.01); *H01L 27/3258* (2013.01); *H01L 27/3262* (2013.01); *H01L 27/3265* (2013.01); *H01L 51/0097* (2013.01); *H01L 51/504* (2013.01); *H01L 51/5203* (2013.01); *G02F 2001/133331* (2013.01); *G02F 2001/133388* (2013.01); *G02F 2201/123* (2013.01); *H01L 51/5265* (2013.01); *H01L 2251/5338* (2013.01)

(58) Field of Classification Search
CPC ................................................ G02F 1/133377
See application file for complete search history.

(56) References Cited

U.S. PATENT DOCUMENTS

| | | | |
|---|---|---|---|
| 6,690,337 B1 | 2/2004 | Mayer, III et al. | |
| 6,906,860 B2* | 6/2005 | Starkweather | G03B 21/62 348/389.1 |
| 2002/0003711 A1* | 1/2002 | Hashimoto | G02B 6/0028 362/551 |
| 2002/0027636 A1* | 3/2002 | Yamada | G02F 1/133305 349/155 |

(Continued)

FOREIGN PATENT DOCUMENTS

EP 2837991 A1 2/2015

OTHER PUBLICATIONS

European Search Report corresponding to EP 16183523.6, dated Sep. 29, 2016, 10 pages.

*Primary Examiner* — Sang V Nguyen
(74) *Attorney, Agent, or Firm* — Innovation Counsel LLP

(57) ABSTRACT

The described technology relates generally to a display device, and the display device according to an exemplary embodiment includes: a main panel; an auxiliary panel positioned at two opposing edges of the main panel; and a cover glass covering a front surface of the main panel and the auxiliary panel, wherein the auxiliary panel has a curved shape.

19 Claims, 16 Drawing Sheets

(56) References Cited

U.S. PATENT DOCUMENTS

| | | | | |
|---|---|---|---|---|
| 2006/0168855 A1* | 8/2006 | D'Urban Jackson | ... | A47F 5/105 40/584 |
| 2007/0295973 A1* | 12/2007 | Jinbo | ... | H01L 27/1214 257/88 |
| 2009/0201443 A1* | 8/2009 | Sasaki | ... | G02F 1/1333 349/70 |
| 2010/0073620 A1* | 3/2010 | Yamaguchi | ... | G02F 1/133305 349/160 |
| 2010/0124603 A1* | 5/2010 | Ito | ... | H01L 27/3246 427/66 |
| 2010/0128112 A1* | 5/2010 | Marti | ... | G06F 3/011 348/51 |
| 2011/0227487 A1* | 9/2011 | Nichol | ... | G02B 6/0018 315/158 |
| 2012/0075166 A1* | 3/2012 | Marti | ... | G06F 3/011 345/1.1 |
| 2012/0081874 A1 | 4/2012 | Wu et al. | | |
| 2012/0146886 A1* | 6/2012 | Minami | ... | H01L 27/3276 345/80 |
| 2012/0287021 A1 | 11/2012 | Park et al. | | |
| 2013/0002133 A1* | 1/2013 | Jin | ... | H01L 51/5253 313/511 |
| 2013/0002572 A1 | 1/2013 | Jin et al. | | |
| 2013/0321740 A1* | 12/2013 | An | ... | H05K 5/0217 349/58 |
| 2014/0055702 A1* | 2/2014 | Park | ... | G02F 1/136286 349/43 |
| 2014/0118308 A1* | 5/2014 | Rhee | ... | G06F 3/0383 345/177 |
| 2014/0139984 A1* | 5/2014 | Jung | ... | G06F 1/1637 361/679.01 |
| 2014/0204316 A1* | 7/2014 | Kim | ... | G02F 1/133377 349/84 |
| 2014/0345791 A1* | 11/2014 | Son | ... | B32B 37/0046 156/228 |
| 2015/0024651 A1 | 1/2015 | Cho et al. | | |
| 2015/0029449 A1 | 1/2015 | Woo et al. | | |
| 2015/0036077 A1 | 2/2015 | Lee et al. | | |
| 2015/0043176 A1 | 2/2015 | Ahn | | |
| 2015/0053943 A1* | 2/2015 | Cho | ... | H01L 27/323 257/40 |
| 2015/0160509 A1 | 6/2015 | Lee et al. | | |

\* cited by examiner

DISPLAY DEVICE

RELATED APPLICATIONS

This application claims priority to and the benefit of Korean Patent Application No. 10-2015-0113267 filed in the Korean Intellectual Property Office on Aug. 11, 2015, the entire contents of which are incorporated herein by reference.

BACKGROUND

1. Field

The described technology relates generally to a display device.

2. Description of the Related Art

A liquid crystal display (LCD) generally includes two display panels on which field generating electrodes, such as a pixel electrode and a common electrode, are formed, and a liquid crystal layer interposed between the two display panels. When a voltage is applied to the field generating electrodes to generate an electric field on the liquid crystal layer, the orientation of liquid crystal molecules of the liquid crystal layer is determined, and the polarization of incident light is controlled through the generated electric field to display an image.

The two display panels forming the liquid crystal display may be a thin film transistor array panel and an opposing display panel. In the thin film transistor array panel, a gate line transmitting a gate signal and a data line transmitting a data signal are formed to be crossed, and a thin film transistor connected to the gate line and the data line and a pixel electrode connected to the thin film transistor may be formed. The opposing display panel may include a light blocking member, a color filter, a common electrode, etc. In some cases, the light blocking member, the color filter, and the common electrode may be formed in the thin film transistor array panel.

The liquid crystal display may be manufactured with a large display area to be used as a TV. In this case, the edge of the TV may be taken advantage of as a secondary region to display a channel, a volume, or a subtitle, and this edge may be bent to form a curved shape. However, a process of bending the conventional liquid crystal display for the edge portion to have the curved shape is not easy.

The above information disclosed in this Background section is only for enhancement of understanding of the background of the described technology and therefore may contain information that does not form the prior art that is already known in this country to a person of ordinary skill in the art.

SUMMARY

The present disclosure provides a display device having an edge with a curved shape.

A display device according to an exemplary embodiment includes: a main panel; an auxiliary panel positioned at two opposing edges of the main panel; and a cover glass covering a front surface of the main panel and the auxiliary panel, wherein the auxiliary panel has a curved shape.

The main panel may have a flat shape.

The cover glass may include a main region covering the main panel and an auxiliary region covering the auxiliary panel, the main region may have the flat shape, and the auxiliary region may have the curved shape.

The main panel may be made of a liquid crystal panel or an organic light emitting panel.

The liquid crystal panel may include a substrate, a thin film transistor positioned on the substrate, a pixel electrode connected to the thin film transistor, a roof layer positioned to be separated from the pixel electrode via a plurality of microcavities on the pixel electrode, a liquid crystal layer filling the microcavities, and an overcoat positioned on the roof layer and sealing the microcavities.

The auxiliary panel may be formed of at least one of the liquid crystal panel, the organic light emitting panel, and the light emitting diode (LED) panel.

The main panel and the auxiliary panel may be integrally formed.

The main panel may have the curved shape.

The bending direction of the main panel and the bending direction of the auxiliary panel may be different.

The main panel may have a concave curved surface in a front view, and the auxiliary panel may have a convex curved surface in a front view.

The cover glass may include a main region covering the main panel and an auxiliary region covering the auxiliary panel, and the main region and the auxiliary region may have the curved shape.

The bending direction of the main region and the bending direction of the auxiliary region may be different.

The main region may have the concave curved surface in a front view, and the auxiliary region may have the convex curved surface in a front view.

The main panel may be formed of the liquid crystal panel or the organic light emitting panel.

The liquid crystal panel may include a substrate, a thin film transistor positioned on the substrate, a pixel electrode connected to the thin film transistor, a roof layer positioned to be separated from the pixel electrode via a plurality of microcavities on the pixel electrode, a liquid crystal layer filling the microcavities, and an overcoat positioned on the roof layer and sealing the microcavities.

The auxiliary panel may be formed of at least one of the liquid crystal panel, the organic light emitting panel, and the light emitting diode (LED) panel.

The main panel and the auxiliary panel may be integrally formed.

The cover glass may be formed of a tempered glass.

The display device may be used as a TV.

The auxiliary panel may display at least one among a channel, a volume, a subtitle, an e-mail, an internet icon, or a biorhythm, or is used as a lamp.

The display device according to an exemplary embodiment has the following effects.

In the display device according to an exemplary embodiment, by separately forming the main panel and the auxiliary panel and adhering them to the cover glass, the display device having the edge of the curved shape may be easily manufactured.

Also, by integrally forming the main panel and the auxiliary panel by using the liquid crystal panel and the organic light emitting panel including the single substrate, the display device having the edge of the curved shape may be easily manufactured.

DETAILED DESCRIPTION

Figure 1:
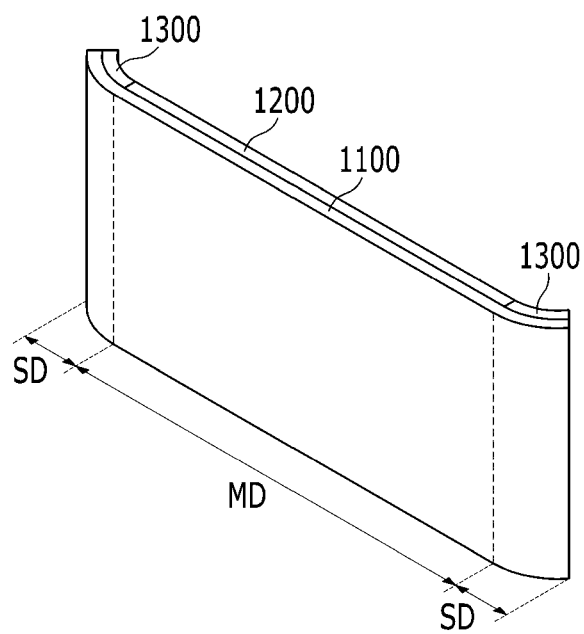
FIG. 1 is a perspective view of a display device according to an exemplary embodiment.

The present system and method are described more fully hereinafter with reference to the accompanying drawings, in which exemplary embodiments of the present system and method are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It is understood that when an element such as a layer, film, region, or substrate is referred to as being "on" another element, it may be directly on the other element, or intervening elements may also be present. In contrast, when an element is referred to as being "directly on" another element, there are no intervening elements present.

First, a display device according to an exemplary embodiment is described with reference to FIG. 1 to FIG. 3.

Figure 2:
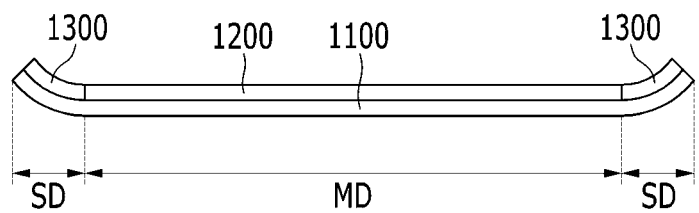
FIG. 2 is a top view of a display device according to an exemplary embodiment.
Figure 3:
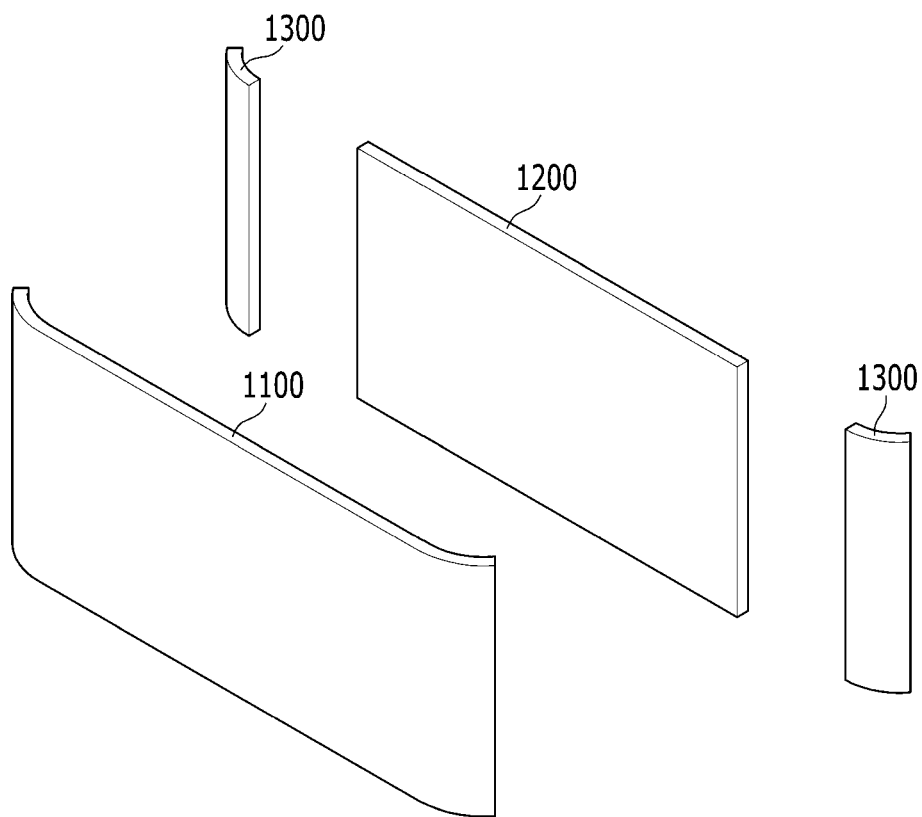
FIG. 3 is an exploded perspective view of a display device according to an exemplary embodiment.

FIG. 1 is a perspective view of a display device according to an exemplary embodiment, FIG. 2 is a top view of a display device according to an exemplary embodiment, and FIG. 3 is an exploded perspective view of a display device according to an exemplary embodiment.

As shown in FIG. 1 to FIG. 3, the display device according to an exemplary embodiment includes a main panel 1200 and an auxiliary panel 1300.

The main panel 1200 may have a flat shape. The main panel 1200 may be a liquid crystal panel or an organic light emitting diode display panel. The liquid crystal panel may have a structure in which a liquid crystal layer is positioned between two substrates. Also, the liquid crystal panel may be made of a single substrate. In this case, the liquid crystal panel may have a structure in which a plurality of microcavities are formed on one sheet substrate, the liquid crystal layer is positioned in the microcavities, and the microcavities are sealed by an overcoat. The structure of the liquid crystal panel and the organic light emitting panel is described in detail with reference to FIG. 4 to FIG. 11.

The auxiliary panel 1300 may have a curved shape. The auxiliary panel 1300 may be made of a liquid crystal panel, organic light emitting panel, or light emitting diode (LED) panel. In this case, the auxiliary panel 1300 includes a substrate of a material that may be bent such as a plastic. In the case of the liquid crystal panel including two sheet substrates, since it is not easy to realize the curved shape, it may be beneficial if the auxiliary panel 1300 is made of a liquid crystal panel, an organic light emitting panel, or a light emitting diode (LED) panel that is formed as a single substrate. However, the present disclosure is not limited thereto, and the auxiliary panel 1300 may be made of various display panels that may easily realize the curved shape.

The main panel 1200 may be positioned at the center, and the auxiliary panel 1300 may be positioned on opposing edges of the main panel 1200. However, the present disclosure is not limited thereto, and the position of the auxiliary panel 1300 may be variously changed. For example, the auxiliary panel 1300 may be positioned on an upper edge and/or a lower edge of the main panel 1200. Also, the auxiliary panel 1300 may be positioned on three or more edges of the main panel 1200.

The display device according to an exemplary embodiment may be manufactured with a large area to be used as a TV. In this case, the main panel 1200 may display a motion picture, such as a movie, a drama, or news. The auxiliary panel 1300 may display other ancillary information. For example, the auxiliary panel 1300 may display a channel, a volume, subtitles, an e-mail, an internet icon, a biorhythm, etc. Also, the auxiliary panel 1300 may be used as a lamp.

The auxiliary panel 1300 may display additional information related thereto when displaying the motion picture on the main panel 1200. For example, the information of the motion picture, such as the channel, the volume, or the subtitles, that are displayed on the main panel 1200 may be displayed on the auxiliary panel 1300. The auxiliary panel 1300 may display the additional information separately regardless of the image displayed on the main panel 1200. For example, the user may check a transmitted mailbox, such as a personal email, through the auxiliary panel 1300, and may write and transmit the email. The auxiliary panel 1300 may display various application program (APP, applications). The auxiliary panel 1300 may also be used when the main panel 1200 is in an off state. For example, when the main panel 1200 is in the off state, the auxiliary panel 1300 may be used as the lamp. That is, the main panel 1200 and the auxiliary panel 1300 may be used to work together, or may be independently used, respectively.

The display device according to an exemplary embodiment may further include a cover glass 1100 covering the main panel 1200 and a front surface of the auxiliary panel 1300.

The cover glass 1100 includes a main region MD and an auxiliary region SD. The main region MD covers the front surface of the main panel 1200, and the auxiliary region SD covers the front surface of the auxiliary panel 1300. Accordingly, the main region MD of the cover glass 1100 may contact the main panel 1200, and the auxiliary region SD may contact the auxiliary panel 1300.

The cover glass 1100 may be made of a transparent and solid material. For example, the cover glass 1100 may be made of a tempered glass, and may be made of Gorilla Glass manufactured by Corning Co. The cover glass 1100 covers the front surface of the main panel 1200 and the auxiliary panel 1300, that is, the surfaces in which the image is displayed, thereby it may be beneficial if the cover glass 1100 is made of a material having high transmittance. Also, since the cover glass 1100 serves to protect the front surface of the main panel 1200 and the auxiliary panel 1300, it may be beneficial if the cover glass 1100 is made of a solid and durable material.

Next, a method manufacturing the display device according to an exemplary embodiment is described as follows.

Firstly, heat is applied to the tempered glass made of a flat substrate to mold the edge to have the curved surface, thereby preparing the cover glass 1100.

Next, the main panel 1200 having the flat shape is adhered to the cover glass 1100. The main panel 1200 may be adhered to the cover glass 1100 by using a transparent adhesive material. The adhesive material may be made of an OCA (optical clear adhesive), an OCR (optical clear resin), or a transparent adhesive sheet.

Next, the auxiliary panel 1300 having the curved shape is adhered to the cover glass 1100. The auxiliary panel 1300 may be adhered to the cover glass 1100 by using a transparent adhesive material.

When applying the liquid crystal panel including two substrates to the large-sized TV, it may not be easy to partially bend the edge to realize the curved surface. In the present exemplary embodiment, by adhering the main panel having the flat shape to the main region of the single cover glass and the auxiliary panel having the curved shape to the auxiliary region, the display device in which the edge is partially curved is easily realized. In this case, it may be beneficial if the auxiliary panel having the curved shape is made of a liquid crystal panel, a organic light emitting panel, or a light emitting diode (LED) panel that is formed as a single substrate.

Figure 4:
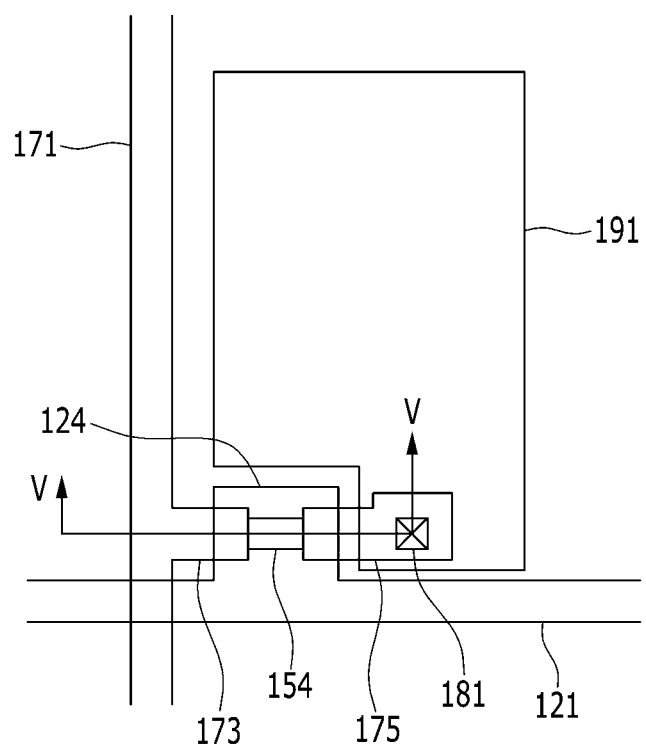
FIG. 4 is a top plan view of a partial panel of a display device according to an exemplary embodiment.
Figure 5:
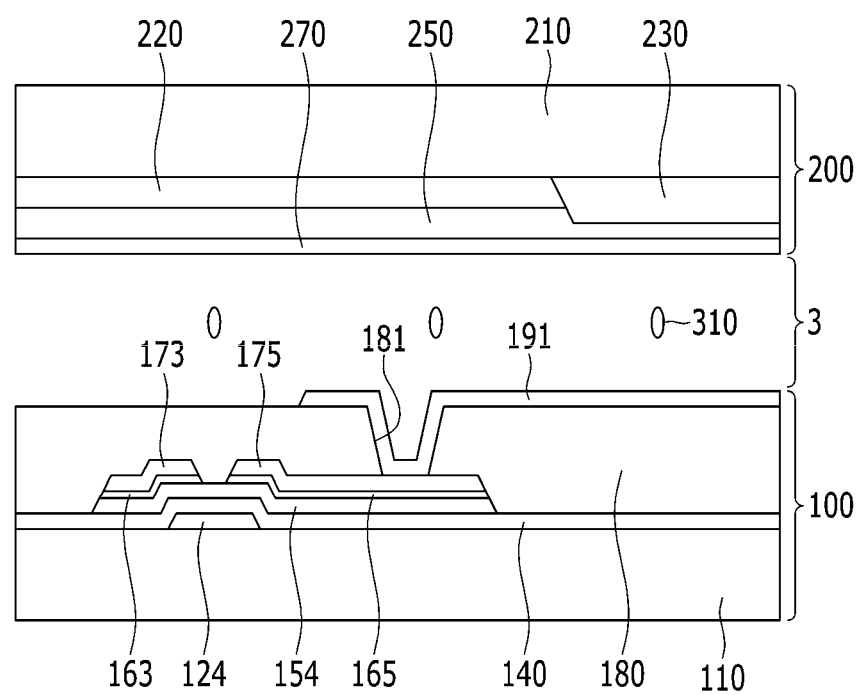
FIG. 5 is a cross-sectional view of a partial panel of a display device according to an exemplary embodiment taken along a line V-V of FIG. 4.

Next, a partial panel of the display device according to an exemplary embodiment is described with reference to FIG. 4 and FIG. 5. FIG. 4 and FIG. 5 show the liquid crystal panel, and particularly, show the liquid crystal panel including two substrates. This may be used as the main panel of the display device according to an exemplary embodiment.

FIG. 4 is a top plan view of a partial panel of a display device according to an exemplary embodiment, and FIG. 5 is a cross-sectional view of a partial panel of a display device according to an exemplary embodiment taken along a line V-V of FIG. 4.

As shown in FIG. 4 and FIG. 5, the liquid crystal panel of the display device according to an exemplary embodiment includes a thin film transistor array panel 100 and an opposing display panel 200, and a liquid crystal layer 3 interposed between the two display panels 100 and 200.

Firstly, the thin film transistor array panel 100 is described.

A gate line 121 and a gate electrode 124 are formed on a first substrate 110 made of a transparent glass or plastic.

The gate line 121 mainly extends in a horizontal direction and transmits a gate signal. The gate signal may consist of a gate-on voltage and a gate-off voltage. The gate electrode 124 is protruded from the gate line 121. The gate electrode 124 receives the gate signal through the gate line 121.

A gate insulating layer 140 is formed on the gate line 121 and the gate electrode 124. The gate insulating layer 140 may be made of an inorganic insulating material such as silicon nitride (SiNx) and silicon oxide (SiOx). The gate insulating layer 140 may be made of a single layer or a multilayer.

A semiconductor 154 is formed on the gate insulating layer 140. The semiconductor 154 is positioned to overlap the gate electrode 124. The semiconductor 154 may be made of an amorphous silicon, a polycrystalline silicon, or a metal oxide.

Ohmic contacts 163 and 165 are formed on the semiconductor 154. The ohmic contacts may be formed of a material, such as n+ hydrogenated amorphous silicon, in which an n-type impurity is doped at a high concentration, or of a silicide. In some cases, the ohmic contacts 163 and 165 may be omitted.

A data conductor including a plurality of data lines 171, a source electrode 173, and a drain electrode 175 is formed on the ohmic contacts 163 and 165.

The data line 171 mainly extends in a longitudinal direction, thereby crossing the gate line 121, and transmits a data signal.

The source electrode 173 is protruded from the data line 171 to overlap the gate electrode 124. The source electrode 173 is formed with a bar shape in the case of FIG. 4, however the present disclosure is not limited thereto, and it may have a shape that is bent, such as the shape of the letter "C".

The drain electrode 175 is formed to be separated from the source electrode 173 and overlapping the gate electrode 124. The source electrode 173 faces the drain electrode 175. When the source electrode 173 is formed with the "C" shape, the source electrode 173 may have a shape enclosing the drain electrode 175. However, the present disclosure is not limited thereto, and the drain electrode 175 may have a shape that is bent, such as the shape of the letter "C".

The gate electrode 124, the source electrode 173, and the drain electrode 175 form a thin film transistor (TFT) along with the semiconductor 154. In this case, the channel of the thin film transistor is formed in the semiconductor 154 in the portion exposed between the source electrode 173 and the drain electrode 175.

A passivation layer 180 is formed on the data line 171, the source electrode 173, the drain electrode 175, and the semiconductor 154. The passivation layer 180 may be made of an organic insulating material or an inorganic insulating material, and may be formed of a single layer or a multilayer.

The passivation layer 180 has a contact hole 181. The contact hole 181 may expose at least a portion of the thin film transistor, particularly at least a portion of the drain electrode 175.

A pixel electrode 191 is formed on the passivation layer 180. The pixel electrode 191 may be made of a transparent metal oxide such as indium tin oxide (ITO) or indium zinc oxide (IZO). The pixel electrode 191 may be made with a rectangular shape approximately including two long sides and two short sides. However, the shape of the pixel electrode 191 is not limited thereto, and may be variously changed. Furthermore, the pixel electrode 191 may be made with a shape having a transverse stem, a longitudinal stem, and a plurality of minute branches extending therefrom. Also, one pixel electrode 191 may be divided into two to form sub-pixel electrodes. In this case, voltages applied to the two sub-pixel electrodes may be different to improve visibility, and the arrangement of thin film transistors connected to the two sub-pixel electrodes may be variously changed.

Although not shown, a lower alignment layer may be formed on the pixel electrode 191 and the passivation layer 180. A lower polarizer may be formed underneath the first substrate 110.

Next the opposing display panel 200 is described.

A color filter 230 and a light blocking member 220 are formed under a second substrate 210, which may be made of transparent glass or plastic.

The liquid crystal panel may include a plurality of pixels, the color filter 230 may be positioned in each pixel, and the light blocking member 220 may be positioned on the boundary of each pixel. The light blocking member 220 may be further formed at a position overlapping the thin film transistor.

The color filter 230 may be made of a red filter, a green filter, and a blue filter. However, the present disclosure is not limited thereto, and the color filter 230 may be made of a cyan filter, a magenta filter, a yellow filter, and a white color filter.

The light blocking member 220 is referred to as a black matrix and prevents light leakage.

A planarizing layer 250 that is made of an organic material to provide the flat surface is formed under the color filter 230 and the black matrix 220.

A common electrode 270 is formed under the planarizing layer 250. The common electrode 270 may be made of a transparent metal oxide such as indium tin oxide (ITO) or indium zinc oxide (IZO).

In the above, the color filter 230 and the light blocking member 220 are formed in the opposing display panel 200, however the present disclosure is not limited thereto. The color filter 230 and/or the light blocking member 220 may be formed in the thin film transistor array panel 100.

Although not shown, an upper alignment layer may be further formed under the common electrode 270. Also, an upper polarizer may be further formed on the top surface of the second substrate 210. Transmissive axes of the lower polarizer and the upper polarizer cross each other. In some cases, one of the two polarizers may be omitted.

The liquid crystal layer 3 includes a plurality of liquid crystal molecules 310. The liquid crystal molecules 310 may have positive dielectric anisotropy or negative dielectric anisotropy. The liquid crystal molecules 310 may be initially aligned with a twisted state, or may be initially aligned in the vertical direction or the horizontal direction.

The common electrode 270 is formed under the second substrate 210, however the present disclosure is not limited thereto. The common electrode 270 may be formed on the first substrate 110, and in such case, the liquid crystal molecules 310 may be horizontally aligned.

Figure 6:
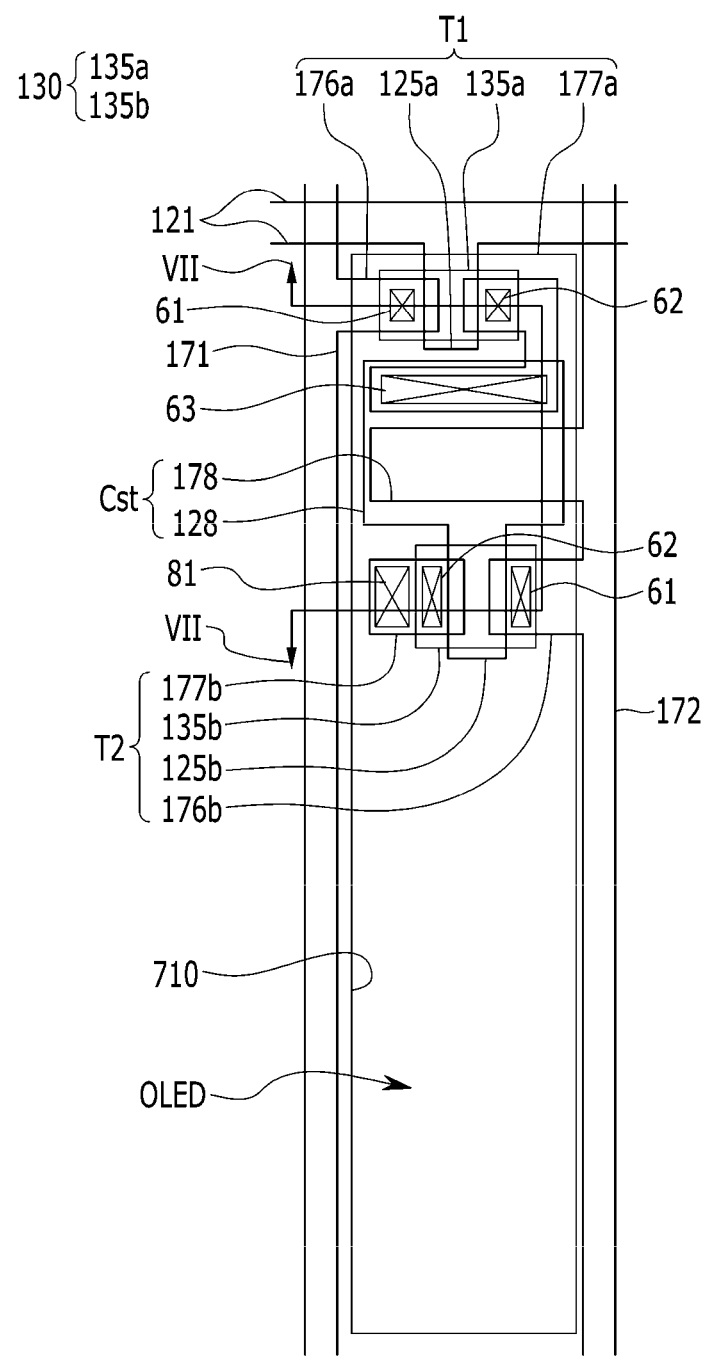
FIG. 6 is a top plan view of a partial panel of a display device according to an exemplary embodiment.
Figure 7:
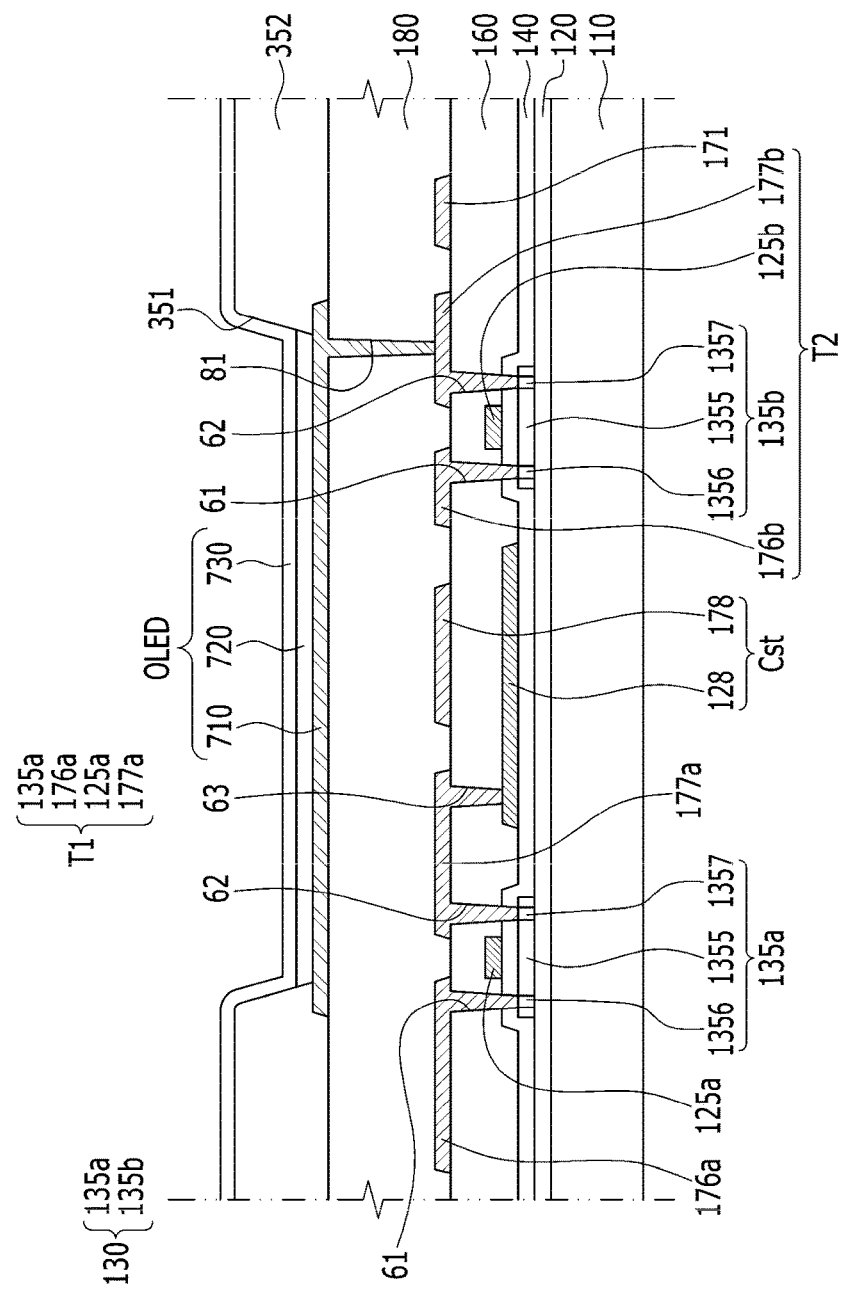
FIG. 7 is a cross-sectional view of a partial panel of a display device according to an exemplary embodiment taken along a line VII-VII of FIG. 6.

Next, a partial panel of the display device according to an exemplary embodiment is described with reference to FIG. 6 and FIG. 7. FIG. 6 and FIG. 7 show the organic light emitting panel. This may be used as the main panel or the auxiliary panel of the display device according to an exemplary embodiment.

FIG. 6 is a top plan view of a partial panel of a display device according to an exemplary embodiment, and FIG. 7 is a cross-sectional view of a partial panel of a display device according to an exemplary embodiment taken along a line VII-VII of FIG. 6.

As shown in FIG. 6 and FIG. 7, in the organic light emitting panel of the display device according to an exemplary embodiment, a buffer layer 120 is formed on the first substrate 110.

The first substrate 110 may be made of a flexible material, and the buffer layer 120 may be made of a single layer of silicon nitride (SiNx) or a dual-layer structure including silicon nitride (SiNx) and silicon oxide (SiOx). The buffer layer 120 prevents the penetration of an unnecessary component, such as an impurity or moisture, and simultaneously serves to planarize the surface.

A semiconductor 130 is formed on the buffer layer 120. The semiconductor 130 includes a switching semiconductor 135a and a driving semiconductor 135b that are separated from each other. The semiconductors 135a and 135b may be made of a polycrystalline semiconductor material or an oxide semiconductor material. When the semiconductor 130 is formed of the oxide semiconductor material, a separate protection layer to protect the oxide semiconductor material that is vulnerable to the external environment, such as high temperature, may be added.

The switching semiconductor 135a and the driving semiconductor 135b are respectively divided into a channel 1355 and a source region 1356 and drain region 1357 formed at respective sides of the channel 1355. The channel 1355 of the switching semiconductor 135a and the driving semiconductor 135b is channel-doped with a doping impurity of an n-type or a p-type, and the source region 1356 and the drain region 1357 of the switching semiconductor 135a and the driving semiconductor 135b are contact doping regions that are contact-doped with a higher doping concentration of the doping impurity than with the channel doping.

The gate insulating layer 140 is formed on the switching semiconductor 135a and the driving semiconductor 135b. The gate insulating layer 140 may be formed of a single layer or a multilayer including at least one of silicon nitride and silicon oxide.

A gate line 121, a driving gate electrode 125b, and a first storage capacitor plate 128 are formed on the gate insulating film 140. The gate line 121 extends in the horizontal direction and transmits a scan signal, and includes a switching gate electrode 125a protruded from the gate line 121 to overlap the switching semiconductor 135a. The driving gate electrode 125b is protruded from the first storage capacitor plate 128 to overlap the driving semiconductor 135b. The switching gate electrode 125a and the driving gate electrode 125b respectively overlap the channel 1355.

An interlayer insulating layer 160 is formed on the gate line 121, the driving gate electrode 125b, and the first storage capacitor plate 128. The interlayer insulating layer 160 may be made of an inorganic insulating material such as silicon nitride (SiNx) or silicon oxide (SiOx) like the gate insulating layer 140. Also, the interlayer insulating layer 160 may be made of an organic insulating material.

The interlayer insulating layer 160 and the gate insulating layer 140 have a source contact hole 61 and a drain contact hole 62 respectively exposing the source region 1356 and the drain region 1357, and a storage contact hole 63 exposing a part of the first storage capacitor plate 128.

On the interlayer insulating layer 160, a data line 171 having a switching source electrode 176a, a driving voltage line 172 having a driving source electrode 176b and a second storage capacitor plate 178, a switching drain electrode 177a connected to the first storage capacitor plate 128, and a driving drain electrode 177b are formed.

The data line 171 transmits the data signal Dm and extends in the direction crossing the gate line 121. The driving voltage line 172 transmits the driving voltage, is separated from the data line 171, and extends in the same direction therewith.

The switching source electrode 176a is protruded from the data line 171 to overlap the switching semiconductor 135a, and the driving source electrode 176b is protruded from the driving voltage line 172 to overlap the driving semiconductor 135b. The switching source electrode 176a and the driving source electrode 176b are respectively connected to the source region 1356 through the source contact hole 61.

The switching drain electrode 177a faces the switching source electrode 176a, the driving drain electrode 177b faces the driving source electrode 176b, and the switching drain electrode 177a and the driving drain electrode 177b are respectively connected to the drain region 1357 through the drain contact hole 62.

The switching drain electrode 177a extends to be electrically connected to the first storage capacitor plate 128 and the driving gate electrode 125b through the storage contact hole 63 formed in the interlayer insulating layer 160.

The second storage capacitor plate 178 is protruded from the data line 171 to overlap the first storage capacitor plate 128. Accordingly, the first storage capacitor plate 128 and the second storage capacitor plate 178 form the storage capacitor Cst via the interlayer insulating layer 160 as the dielectric material.

The switching semiconductor 135a, the switching gate electrode 125a, the switching source electrode 176a, and the switching drain electrode 177a form the switching transistor T1, and the driving semiconductor 135b, the driving gate electrode 125b, the driving source electrode 176b, and the driving drain electrode 177b form the driving transistor T2.

The passivation layer 180 is formed on the switching source electrode 176a, the driving source electrode 176b, the switching drain electrode 177a, and the driving drain electrode 177b.

A pixel electrode 710 is formed on the passivation layer 180, and the pixel electrode 710 may be made of a transparent conductive material, such as indium tin oxide (ITO), indium zinc oxide (IZO), zinc oxide (ZnO), or indium oxide (In2O3), or a reflective metal, such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected with the driving drain electrode 177b of the driving transistor T2 through a contact hole 81 formed in the interlayer insulating layer 160 to become an anode of an organic light emitting diode OLED.

A pixel defining layer 352 is positioned on the passivation layer 180 and an edge of the pixel electrode 710. The pixel defining layer 352 has a pixel opening 351 exposing the pixel electrode 710. The pixel defining layer 352 may include a resin, such as a polyacrylate or polyimide, a silica-based inorganic material, and the like.

An organic emission layer 720 is formed in the pixel opening 351 of the pixel defining layer 352. The organic emission layer 720 is formed as a multilayer including one or more of an emission layer, a hole-injection layer (HIL), a hole-transporting layer (HTL), an electron-transporting layer (ETL), and an electron-injection layer (EIL). In the case where the organic emission layer 720 includes all the layers, the hole-injection layer is positioned on the pixel electrode 710, which is an anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, the organic emission layer 720 may implement the color image by laminating the red organic emission layer, the green organic emission layer, and the blue organic emission layer together in the red pixel, the green pixel, and the blue pixel, and forming a red color filter, a green color filter, and a blue color filter for each pixel. As another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, may not need to be used.

A common electrode 730 is formed on the pixel defining layer 352 and the organic emission layer 720. The common electrode 730 may be made of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 becomes the cathode of the organic light emitting diode OLED. The pixel electrode 710, the organic emission layer 720, and the common electrode 730 configure the organic light emitting diode OLED.

Next, a partial panel of the display device according to an exemplary embodiment is described with reference to FIG. 8 to FIG. 11. FIG. 8 to FIG. 11 show the liquid crystal panel, and particularly show the liquid crystal panel including the single substrate. This may be used as the main panel or the auxiliary panel of the display device according to an exemplary embodiment.

Figure 8:
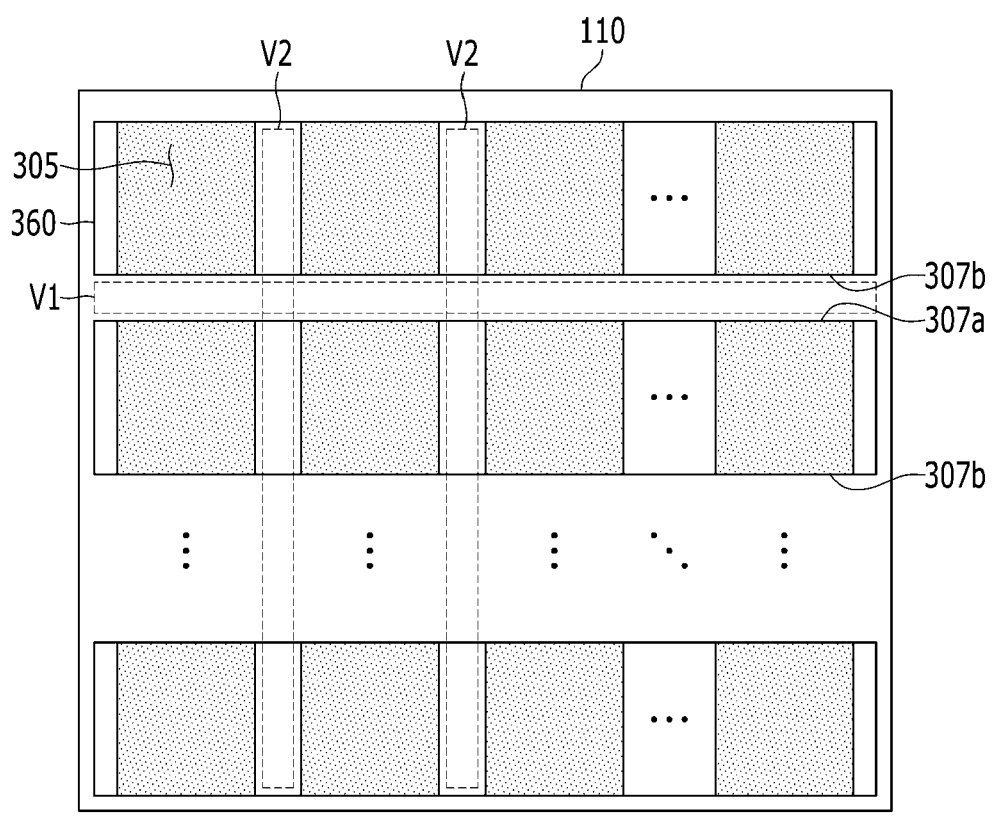
FIG. 8 is a top plan view of a partial panel of a display device according to an exemplary embodiment.
Figure 9:
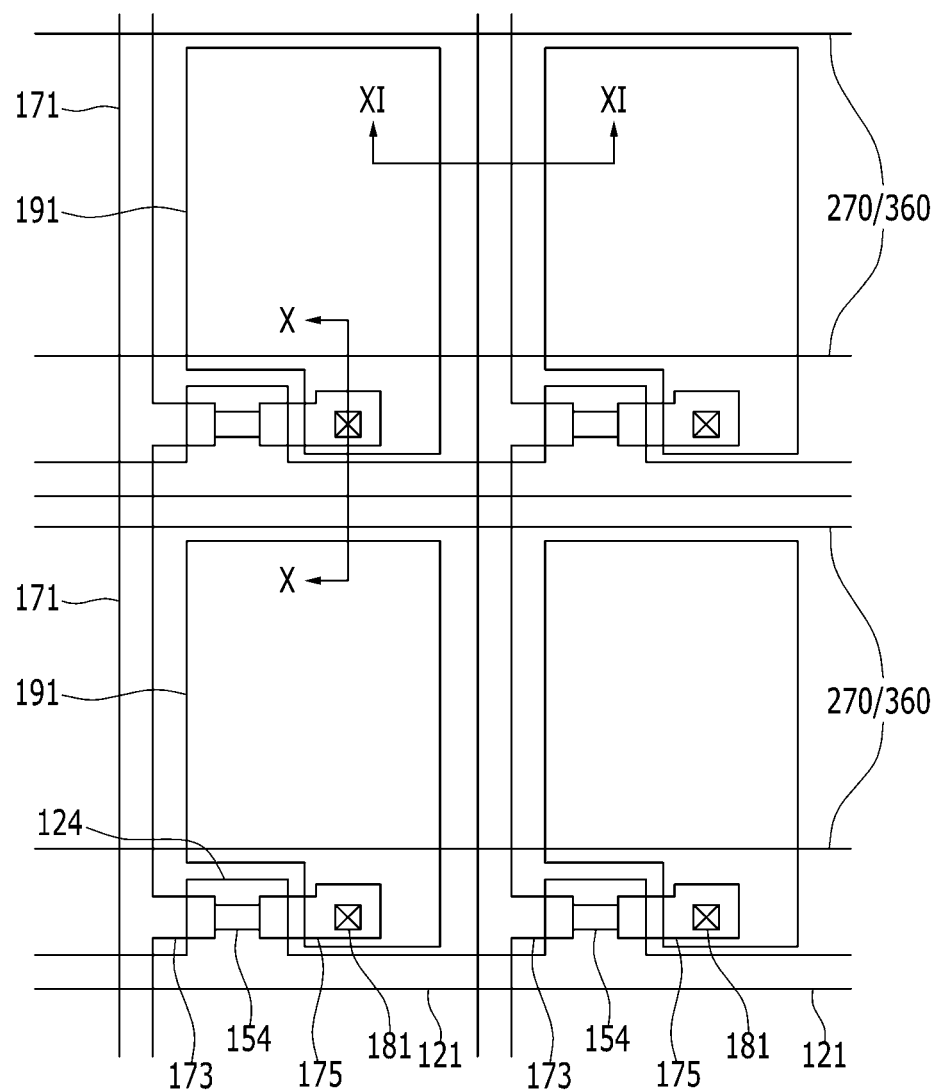
FIG. 9 is a top plan view of a partial pixel of a partial panel of a display device according to an exemplary embodiment.
Figure 10:
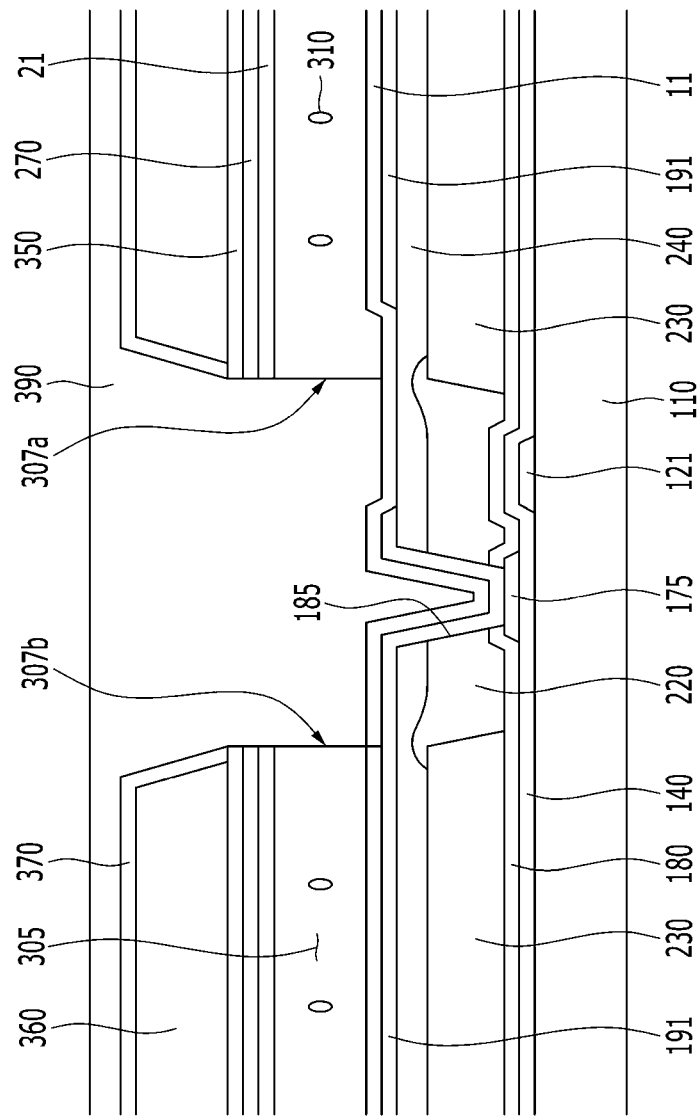
FIG. 10 is a cross-sectional view of a partial panel of a display device according to an exemplary embodiment taken along a line X-X of FIG. 9.
Figure 11:
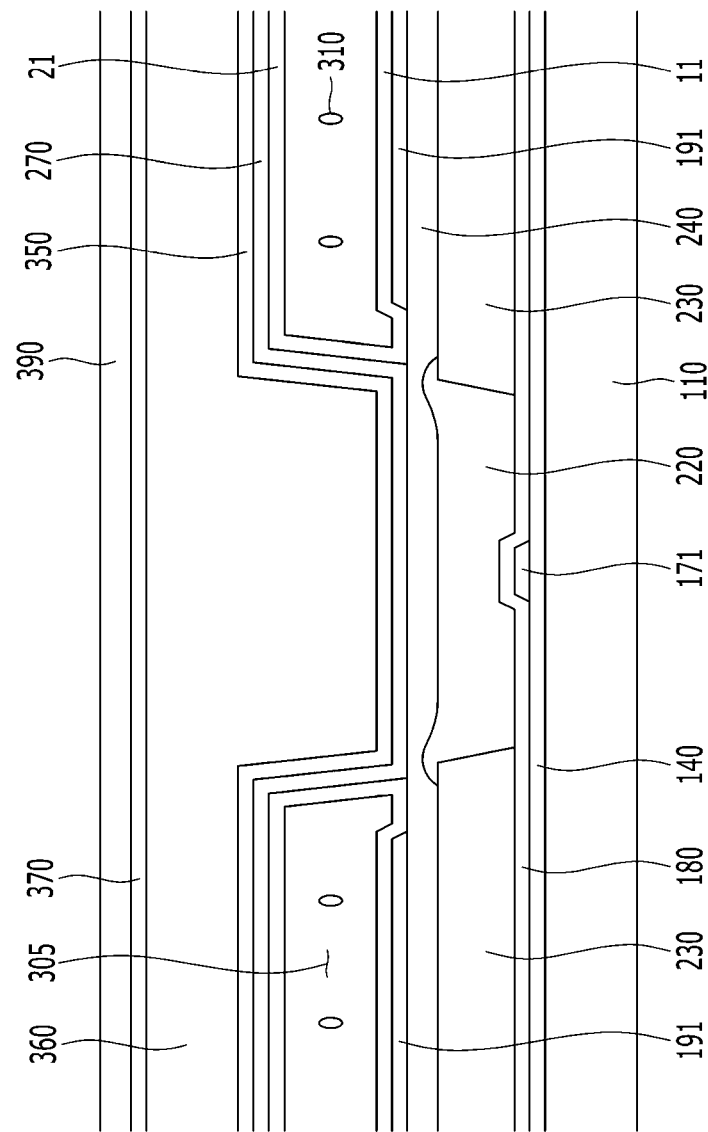
FIG. 11 is a cross-sectional view of a partial panel of a display device according to an exemplary embodiment taken along a line XI-XI of FIG. 9.

FIG. 8 is a top plan view of a partial panel of a display device according to an exemplary embodiment, and FIG. 9 is a top plan view of a partial pixel of a partial panel of a display device according to an exemplary embodiment. FIG. 10 is a cross-sectional view of a partial panel of a display device according to an exemplary embodiment taken along a line X-X of FIG. 9, and FIG. 11 is a cross-sectional view of a partial panel of a display device according to an exemplary embodiment taken along a line XI-XI of FIG. 9.

As shown in FIG. 8, in the liquid crystal panel of the display device according to an exemplary embodiment, a microcavity 305 covered by a roof layer 360 is formed on the first substrate 110.

The first substrate 110 may be made of a flexible material.

The roof layer 360 extends in a row direction, and a plurality of microcavities 305 are formed below one roof layer 360. However, the present disclosure is not limited thereto, and the roof layer 360 may extend in a column direction.

The microcavities 305 may be disposed in a matrix format, a first region V1 is provided between the adjacent microcavities 305 provided in a column direction, and a second region V2 is provided between the adjacent microcavities 305 provided in a row direction.

The first region V1 is provided between adjacent roof layers 360 of plurality of roof layers 360. The microcavities 305 may not be covered by the roof layer 360 but may be exposed to the outside at portions contacting the first region V1. The portions are referred to as injection holes 307a and 307b.

The injection holes 307a and 307b are formed on respective edges of the microcavity 305. The injection holes 307a and 307b are configured with a first injection hole 307a and a second injection hole 307b. In detail, the first injection hole 307a is formed to expose a side of a first edge of the microcavity 305, and the second injection hole 307b is formed to expose a side of a second edge of the microcavity 305. The side of the first edge of the microcavity 305 faces the side of the second edge.

The roof layers 360 are respectively formed to be separate from the substrate 110 between adjacent second regions V2 to form the microcavities 305. That is, the roof layers 360 are formed to cover sides other than the sides of the first edge and the second edge on which the injection holes 307a and 307b are formed.

The above-described configuration of the display device according to an exemplary embodiment is an example, and various modifications are possible. For example, the dispositions of the microcavity 305, the first region V1, and the second region V2 are changeable, a plurality of roof layers 360 may be connected to each other in the first region V1, and part of the roof layers 360 may be formed to be separate from the substrate 110 in the second region V2 to connect adjacent microcavities 305.

As shown in FIG. 9 to FIG. 11, the gate line 121 and the gate electrode 124 protruded from the gate line 121 are formed on the first substrate 110.

The gate line 121 mainly extends in the transverse direction, and transmits the gate signal. The gate line 121 is positioned between the two microcavities 305 that are adjacent in a column direction. That is, the gate line 121 is positioned at the first valley V1. The gate electrode 124 protrudes from the gate line 121.

The gate insulating layer 140 is formed on the gate line 121 and the gate electrode 124. The gate insulating layer 140 may be made of an inorganic insulating material such as silicon nitride (SiNx) and silicon oxide (SiOx). Also, the gate insulating layer 140 may be formed of a single layer or a multilayer.

The semiconductor 154 is formed on the gate insulating layer 140. The semiconductor 154 may overlap the gate electrode 124. The semiconductor 154 may be made of amorphous silicon, polycrystalline silicon, or metal oxide.

The ohmic contacts (not shown) may be formed on the semiconductor 154. The ohmic contacts may be made of a silicide or of a material of n+ hydrogenated amorphous silicon doped with an n-type impurity at a high concentration.

On the semiconductor 154 and the gate insulating layer 140, the data line 171, the source electrode 173, and the drain electrode 175 are formed.

The data line 171 transmits the data signal and mainly extends in the vertical direction thereby crossing the gate line 121. The data line 171 is positioned between the two microcavities 305 which are adjacent in the row direction. That is, the data line 171 is positioned at the second valley V2.

The source electrode 173 is formed to be protruded from the data line 171 on the gate electrode 124. That is, at least a portion of the source electrode 173 may overlap the gate electrode 124. The drain electrode 175 is formed to be separated from the source electrode 173. At least a portion of the drain electrode 175 may overlap the gate electrode 124. In the present exemplary embodiment, the source electrode 173 and the drain electrode 175 are formed of the bar shape, however the present disclosure is not limited thereto. The shape of the source electrode 173 and the drain electrode 175 may be variously changed. For example, the source electrode 173 may be formed of a bent shape of the letter "U", thereby enclosing the drain electrode 175. In another case, the drain electrode 175 may be formed of the bent shape of the letter "U" enclosing the source electrode 173. In additional, the source electrode 173 and the drain electrode 175 are partially overlapped with the gate electrode 124, however the present disclosure is not limited thereto. The source electrode 173 and the drain electrode 175 may not overlap the gate electrode 124, thereby being separated by a predetermined distance.

The gate electrode 124, the source electrode 173, and the drain electrode 175 form the thin film transistor (TFT) along with the semiconductor 154. In this case, the channel of the thin film transistor is formed in the semiconductor 154 between the source electrode 173 and the drain electrode 175.

The passivation layer 180 is formed on the data line 171, the source electrode 173, the drain electrode 175, and the semiconductor 154. The passivation layer 180 may be made of an organic insulating material or an inorganic insulating material, and may be formed of a single layer or a multilayer.

The color filter 230 is formed in each pixel on the passivation layer 180.

Each color filter may express one of the primary colors such as three primary colors including red, green, and blue. However, the colors displayed by the color filter 230 are not limited to the three primary colors such as red, green, and blue, and the color filter 230 may express one of cyan, magenta, yellow, and white-based colors. According to an embodiment, the color filter 230 is not formed at the first region V1 and/or the second region V2.

The light blocking member 220 is formed at a region between the adjacent color filters 230. The light blocking member 220 is formed on a boundary of the pixel PX and the switching element to prevent light leakage. That is, the light blocking member 220 may be formed in the first valley V1 and the second valley V2. The color filter 230 and the light blocking member 220 may be overlapped in the partial region.

A first insulating layer 240 may be further formed on the color filter 230 and the light blocking member 220. The first insulating layer 240 may be formed of an organic insulating material, and may serve to planarize the upper surface of the color filter 230 and the light blocking member 220. The first insulating layer 240 may be made of a dual layer including a layer made of an organic insulating material and a layer made of an inorganic insulating material. The first insulating layer 240 may be omitted in some cases.

The passivation layer 180, the light blocking member 220, and the first insulating layer 240 have a contact hole 185.

The contact hole 185 exposes at least a portion of the thin film transistor, and particularly exposes at least a portion of the drain electrode 175.

The pixel electrode 191 is formed on the first insulating layer 240. The pixel electrode 191 may be made of a transparent metal oxide such as indium tin oxide (ITO) and indium zinc oxide (IZO).

The pixel electrode 191 is formed of an approximate rectangle shape having two long sides and two short sides, and has the shape in which the portion overlapping the thin film transistor is chamfered. However, the shape of the pixel electrode 191 is not limited thereto and may be variously changed. Furthermore, the pixel electrode 191 may be made of a shape having a transverse stem, a longitudinal stem, and a plurality of minute branches extending therefrom. Also, one pixel electrode 191 may be divided into two to form sub-pixel electrodes. In this case, the voltages applied to two sub-pixel electrodes may be different to improve visibility, and the arrangement of the thin film transistors connected to the two sub-pixel electrodes may be variously changed.

The common electrode 270 is formed on the pixel electrode 191 to be separated by a predetermined distance from the pixel electrode 191. The plurality of microcavities 305 are formed between the pixel electrode 191 and the common electrode 270. That is, the microcavities 305 are enclosed by the pixel electrode 191 and the common electrode 270. The common electrode 270 extends in the row direction and is formed over the microcavities 305 and in the second region V2. The common electrode 270 is formed to cover part of an upper side and a lateral side of the microcavity 305.

The present disclosure, however, is not limited thereto, and the common electrode 270 may be formed between the pixel electrode 191 and the insulating layer. The microcavity 305 may be formed on the common electrode 270.

The common electrode 270 may be made of a transparent metal oxide such as indium tin oxide (ITO) or indium zinc oxide (IZO). A predetermined voltage may be applied to the common electrode 270, and an electric field may be formed between the pixel electrode 191 and the common electrode 270.

Alignment layers 11 and 21 are respectively formed above the pixel electrode 191 and below the common electrode 270.

The alignment layers 11 and 21 include a first alignment layer 11 and a second alignment layer 21. The first alignment layer 11 and the second alignment layer 21 may be formed as vertical alignment layers, and may be made of an alignment material such as polyamic acid, polysiloxane, or polyimide. The first and second alignment layers 11 and 21 may be connected on a side wall at an edge of the microcavity 305.

The first alignment layer 11 is formed on the pixel electrode 191. The first alignment layer 11 may be formed directly on a portion of the first insulating layer 240 that is not covered by the pixel electrode 191. The first alignment layer 11 may also be formed in the first region V1.

The second alignment layer 21 is formed below the common electrode 270 so that it may face the first alignment layer 11.

A liquid crystal layer formed with liquid crystal molecules 310 is formed in the microcavity 305 provided between the pixel electrode 191 and the common electrode 270. The liquid crystal molecules 310 may have negative dielectric anisotropy such that they may stand vertically with respect to the substrate 110 when no electric field is applied. That is, vertical alignment may be performed. However, the present disclosure is not limited thereto, and the liquid crystal molecules may be horizontally aligned.

The pixel electrode 191 to which the data voltage is applied generates an electric field with the common electrode 270 to determine an alignment direction of the liquid crystal molecules 310 provided in the microcavity 305 between the electrodes 191 and 27. Luminance of light passing through the liquid crystal layer is changed by the determined alignment direction of the liquid crystal molecules 310.

A second insulating layer 350 may be formed on the common electrode 270. The second insulating layer 350 may be formed with an inorganic insulating material such as silicon nitride (SiNx) or silicon oxide (SiOx), and it may be omitted in certain cases.

The roof layer 360 is formed on the second insulating layer 350. The roof layer 360 may be made of an organic material. The roof layer 360 is formed in a row direction, and is formed over the microcavities 305 and in the second region V2. The roof layer 360 is formed to cover part of the upper side and the lateral side of the microcavities 305. The roof layer 360 is made hard by a curing process to maintain the form of the microcavities 305. The roof layer 360 is formed to be separate from the pixel electrode 191 with the microcavities 305 therebetween.

The common electrode 270 and the roof layer 360 are formed to not cover part of the lateral side at the edge of the microcavity 305, and the portions of the microcavity 305 that are not covered by the common electrode 270 and the roof layer 360 are referred to as injection holes 307a and 307b. The injection holes 307a and 307b consist of a first injection hole 307a that exposes a lateral side at the first edge of the microcavity 305 and a second injection hole 307b that exposes a lateral side at the second edge of the microcavity 305. The first edge faces the second edge, and for example, the first edge may be an upper edge of the microcavity 305 and the second edge may be a lower edge of the microcavity 305 on the floor plan. The microcavity 305 is exposed by the injection holes 307a and 307b in the process of manufacturing a display device so that an aligning agent or a liquid crystal material may be injected into the microcavity 305 through the injection holes 307a and 307b.

A third insulating layer 370 may be further formed on the roof layer 360. The third insulating layer 370 may be made of an inorganic insulating material such as silicon nitride (SiNx) or silicon oxide (SiOx). The third insulating layer 370 may be formed to cover the upper side and/or the lateral side of the roof layer 360. The third insulating layer 370 protects the roof layer 360 made of an organic material, and it may be omitted in certain cases.

An overcoat 390 (encapsulation layer) is formed on the third insulating layer 370. The overcoat 390 is formed to cover the injection holes 307a and 307b where a part of the microcavity 305 is exposed to the outside. That is, the overcoat 390 may seal the microcavity 305 so that the liquid crystal molecules 310 formed in the microcavity 305 are not discharged to the outside. Since the overcoat 390 is in contact with the liquid crystal molecules 310, it would be beneficial if the overcoat 390 is formed of a material that does not react with the liquid crystal molecules 310. For example, the overcoat 390 may be formed of parylene or the like.

The overcoat 390 may be made as a multilayer such as a dual layer or a triple layer. The dual layer includes two layers made of different materials. The triple layer includes three layers, and materials of two adjacent layers are different from each other. For example, the overcoat 390 may include a layer made of an organic insulating material and a layer made of an inorganic insulating material.

Next, the display device according to an exemplary embodiment is described with reference to FIG. 12 to FIG. 14.

Figure 12:
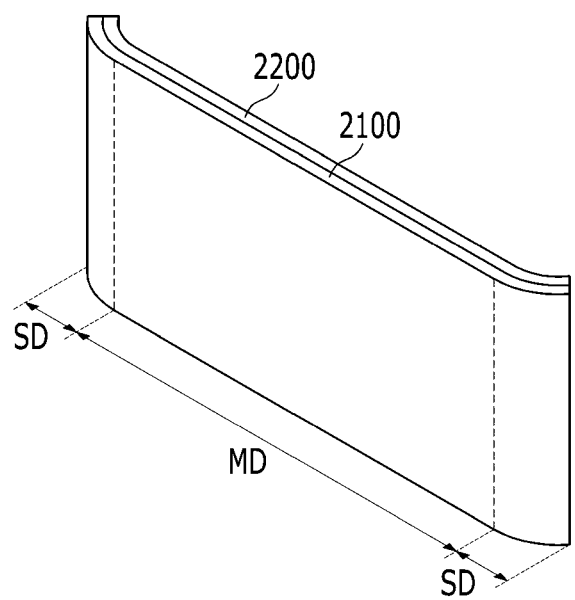
FIG. 12 is a perspective view of a display device according to an exemplary embodiment.
Figure 13:
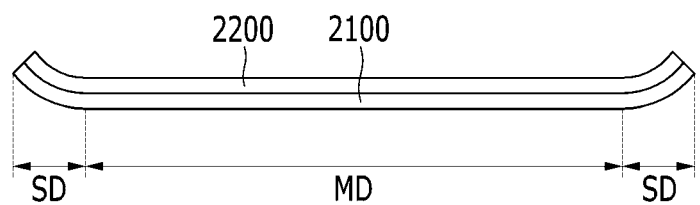
FIG. 13 is a top view of a display device according to an exemplary embodiment.
Figure 14:
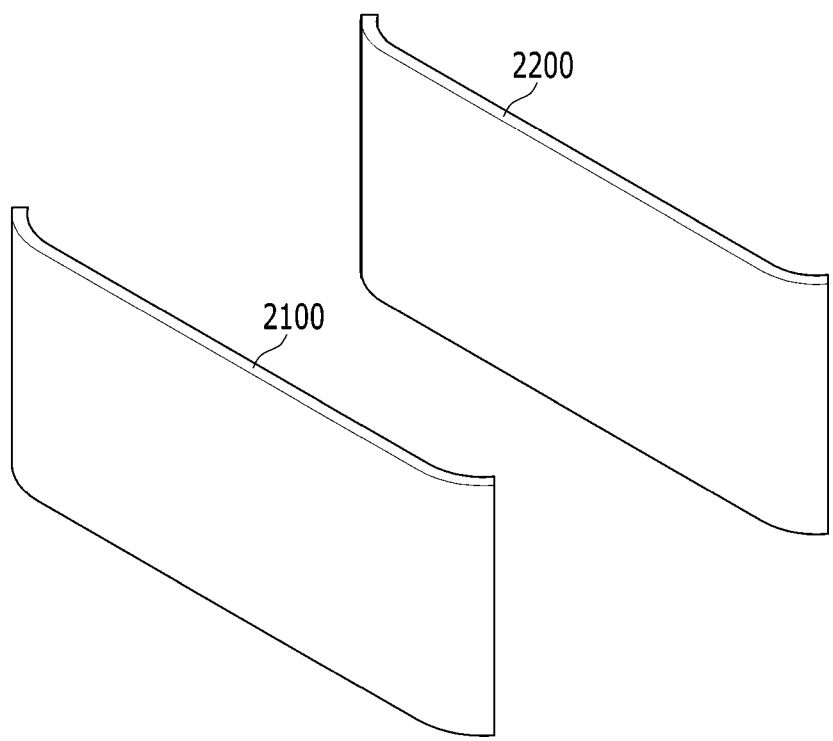
FIG. 14 is an exploded perspective view of a display device according to an exemplary embodiment.

The display device according to an exemplary embodiment shown in FIG. 12 to FIG. 14 is the same as most of the display device according to an exemplary embodiment shown in FIG. 1 to FIG. 3. As such, an overlapping description thereof is omitted. The present exemplary embodiment is different from the previous exemplary embodiment in that the main panel and the auxiliary panel are integrally formed, and this is described as follows.

FIG. 12 is a perspective view of a display device according to an exemplary embodiment, FIG. 13 is a top view of a display device according to an exemplary embodiment, and FIG. 14 is an exploded perspective view of a display device according to an exemplary embodiment.

As shown in FIG. 12 to FIG. 14, the display device according to an exemplary embodiment includes one panel 2200 in which the main panel and the auxiliary panel are integrally formed.

The panel 2200 may have a center portion of the flat shape and two edge portions of the curved shape. The panel 2200 may be made of a liquid crystal panel or an organic light emitting panel. It may be beneficial if the edge portion is partially formed of a flexible material to be easily bent in the panel 2200. For example, like the organic light emitting panel shown in FIG. 6 and FIG. 7 and the liquid crystal panel shown in FIG. 8 to FIG. 11, the display panel made of one substrate may undergo the process of only easily bending the partial region.

The display device according to an exemplary embodiment may further include a cover glass 2100 covering the front surface of the panel 2200.

The cover glass 2100 includes a main region MD and an auxiliary region SD. The main region MD of the cover glass 2100 covers the front surface of the center portion of the panel 2200, and the auxiliary region SD covers the front surface of opposing edges of the panel 2200. Accordingly, the main region MD of the cover glass 2100 may contact the portion having the flat shape of the panel 2200, and the auxiliary region SD may contact the portion having the curved shape.

Next, the display device according to an exemplary embodiment is described with reference to FIG. 15 to FIG. 17.

Figure 15:
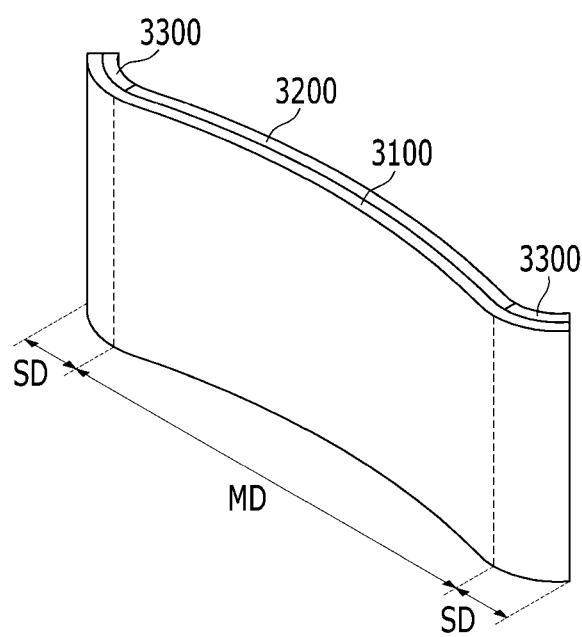
FIG. 15 is a perspective view of a display device according to an exemplary embodiment.
Figure 16:
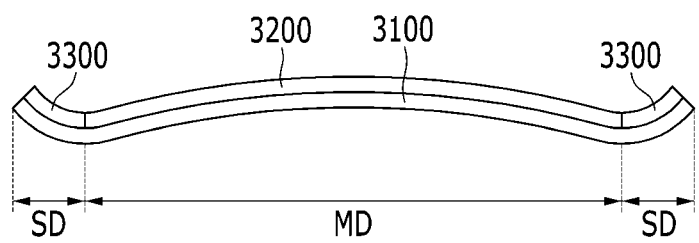
FIG. 16 is a top view of a display device according to an exemplary embodiment.
Figure 17:
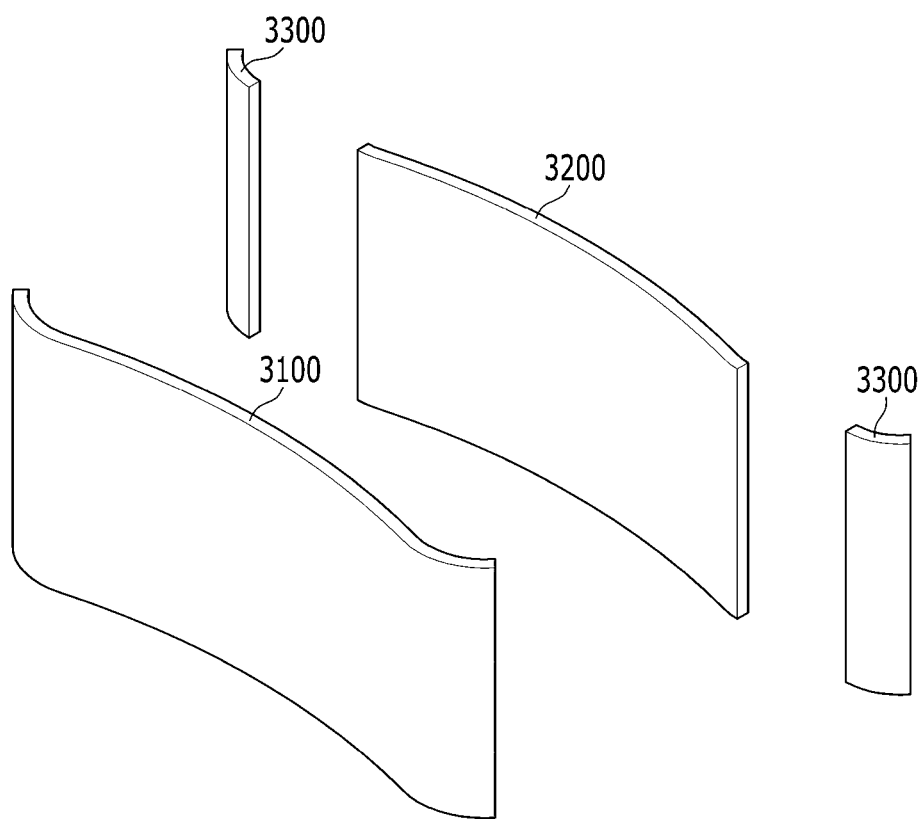
FIG. 17 is an exploded perspective view of a display device according to an exemplary embodiment.

The display device according to an exemplary embodiment shown in FIG. 15 to FIG. 17 is the same as most of the display device according to an exemplary embodiment shown in FIG. 1 to FIG. 3. As such, an overlapping detailed description thereof is omitted. In the present exemplary embodiment, the main panel has the curved shape, differently from the previous exemplary embodiment, and this is described in detail.

FIG. 15 is a perspective view of a display device according to an exemplary embodiment, FIG. 16 is a top view of a display device according to an exemplary embodiment, and FIG. 17 is an exploded perspective view of a display device according to an exemplary embodiment.

As shown in FIG. 15 to FIG. 17, the display device according to an exemplary embodiment includes the main panel 3200 and the auxiliary panel 3300.

The main panel 3200 may have the curved shape. The main panel 3200 may be formed of a liquid crystal panel, an organic light emitting panel, etc. For example, the main panel 3200 may be formed of the liquid crystal panel shown in FIG. 4 and FIG. 5, the organic light emitting panel shown in FIG. 6 and FIG. 7, or the liquid crystal panel shown in FIG. 8 to FIG. 11.

The auxiliary panel 3300 may have the curved shape. The auxiliary panel 3300 may be formed of the liquid crystal panel, the organic light emitting panel, the light emitting diode (LED) panel, etc. For example, the auxiliary panel 3300 may be made of the organic light emitting panel shown in FIG. 6 and FIG. 7, or the liquid crystal panel shown in FIG. 8 to FIG. 11.

In the present exemplary embodiment, the main panel 3200 and the auxiliary panel 3300 both have the curved shape. In this case, the bending direction of the main panel 3200 and the bending direction of the auxiliary panel 3300 are different. For example, the main panel 3200 may have a concave curved surface in a front view, and the auxiliary panel 3300 may have a convex curved surface in a front view. Alternatively, the main panel 3200 may have a convex curved surface in a front view, and the auxiliary panel 3300 may have a concave curved surface in a front view. Also, the curvature of the main panel 3200 and the curvature of the auxiliary panel 3300 may be different.

The display device according to an exemplary embodiment may further include a cover glass 3100 covering the front surface of the main panel 3200 and the auxiliary panel 3300.

The cover glass 3100 includes a main region MD and an auxiliary region SD. The main region MD of the cover glass 3100 covers the front surface of the main panel 3200, and the auxiliary region SD covers the front surface of the auxiliary panel 3300. Accordingly, the main region MD of the cover glass 3100 may contact the main panel 3200, and the auxiliary region SD may contact the auxiliary panel 3300.

The bending direction of the main region MD of the cover glass 3100 and the bending direction of the auxiliary region SD are different. For example, the main region MD of the cover glass 3100 may have a concave curved surface in a front view, and the auxiliary region SD may have a convex curved surface in a front view. Alternatively, the main region MD of the cover glass 3100 may have the convex curved surface in a front view, and the auxiliary region SD may have the concave curved surface in a front view. Also, the curvature of the main region MD of the cover glass 3100 and the curvature of the auxiliary region SD may be different.

The bending direction of the main region MD of the cover glass 3100 and the bending direction of the main panel 3200 are the same. The bending direction of the auxiliary region SD of the cover glass 3100 and the bending direction of the auxiliary panel 3300 are the same. Also, the curvature of the main region MD of the cover glass 3100 and the curvature of the main panel 3200 are substantially the same. The curvature of the auxiliary region SD of the cover glass 3100 and the curvature of the auxiliary panel 3300 are substantially the same.

When applying the liquid crystal panel including two substrates to the large-sized TV, it may not easy to realize the curved surface having the different bending directions for each region. In the present exemplary embodiment, by adhering the panel having the different directions on the main region and the auxiliary region of the single cover glass, the display device having the curved surface that is bent in the various directions may be easily realized. In this case, the auxiliary panel may be beneficially formed of a liquid crystal panel, a organic light emitting panel, or a light emitting diode (LED) panel that is formed as a single substrate.

The display device according to an exemplary embodiment is now described with reference to FIG. 18 to FIG. 20.

Figure 18:
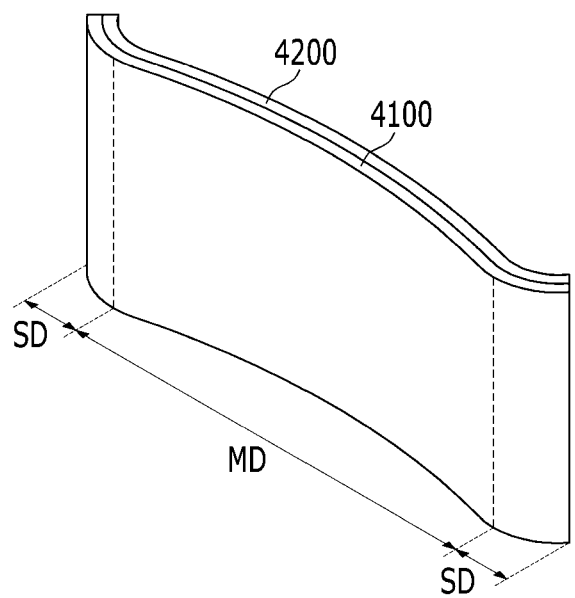
FIG. 18 is a perspective view of a display device according to an exemplary embodiment.
Figure 19:
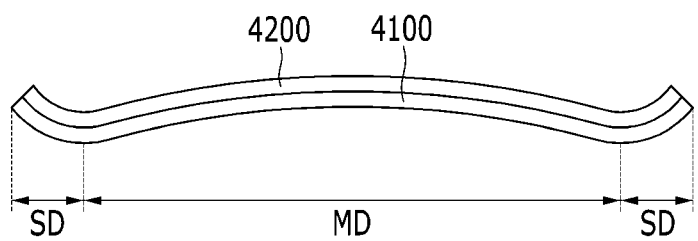
FIG. 19 is a top view of a display device according to an exemplary embodiment.
Figure 20:
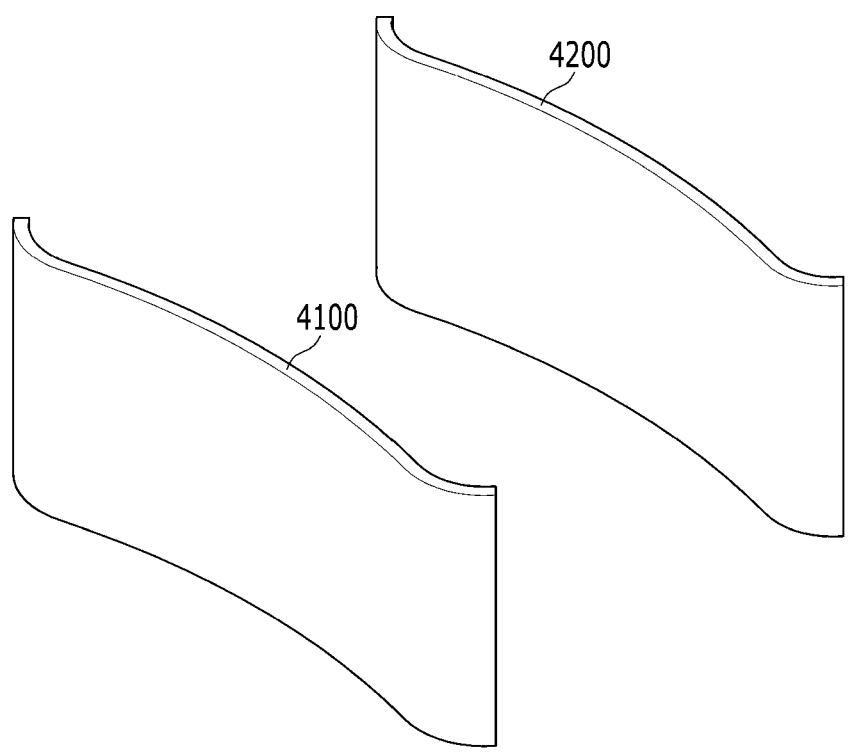
FIG. 20 is an exploded perspective view of a display device according to an exemplary embodiment.

The display device according to an exemplary embodiment shown in FIG. 18 to FIG. 20 is the same as most of the display device according to an exemplary embodiment shown in FIG. 15 to FIG. 17. In the present exemplary embodiment, the main panel and the auxiliary panel are integrally formed, different from the previous exemplary embodiment.

FIG. 18 is a perspective view of a display device according to an exemplary embodiment, FIG. 19 is a top view of a display device according to an exemplary embodiment, and FIG. 20 is an exploded perspective view of a display device according to an exemplary embodiment.

As shown in FIG. 18 to FIG. 20, the display device according to an exemplary embodiment includes one panel 4200 in which the main panel and the auxiliary panel are integrated.

The panel 4200 may have a center portion and two edge portions having the curved shape. In this case, the bending direction of the center portion of the panel 4200 and the bending direction of both edge portions are different. For example, the center portion of the panel 4200 may have a concave curved surface in a front view, and the two edge portions may have a convex curved surface. Alternatively, the center portion of the panel 4200 may have a convex curved surface in a front view, and the two edge portions may have a concave curved surface. Also, the curvature of the center portion of the panel 4200 and the curvature of both edge portions may be different.

The panel 4200 may be formed of a liquid crystal panel or an organic light emitting panel. It may be beneficial if the center portion and the two edge portions of the panel 4200 are formed of a flexible material in the different directions. For example, the panel 4200 may be formed of the display panel including one substrate like the organic light emitting panel shown in FIG. 6 and FIG. 7 or the liquid crystal panel shown in FIG. 8 to FIG. 11.

The display device according to an exemplary embodiment may further include a cover glass 4100 covering the front surface of the panel 4200.

The cover glass 4100 includes a main region MD and an auxiliary region SD. The main region MD of the cover glass 4100 covers the front surface of the center portion of the panel 4200, and the auxiliary region SD covers the front surface of the two edge portions of the panel 4200. Accordingly, the main region MD of the cover glass 4100 may contact the center portion of the panel 4200, and the auxiliary region SD may contact the two edge portions of the panel 4200.

The bending direction of the main region MD of the cover glass 4100 and the bending direction of the auxiliary region SD are different. Also, the curvature of the main region MD of the cover glass 4100 and the curvature of the auxiliary region SD may be different.

The bending direction of the main region MD of the cover glass 4100 and the bending direction of the center portion of the panel 4200 are the same. The bending direction of the auxiliary region SD of the cover glass 4100 and the bending direction of the two edge portions of the panel 4200 are the same. Also, the curvature of the main region MD of the cover glass 4100 and the curvature of the center portion of the panel 4200 are substantially the same. The curvature of the auxiliary region SD of the cover glass 4100 and the curvature of the two edge portions of the panel 4200 are substantially the same.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS 1100, 2100, 3100, 4100: cover glass
1200, 3200: main panel
1300, 3300: auxiliary panel
2200, 4200: panel

What is claimed is:

1. A display device comprising:
a main panel;
an auxiliary panel positioned at each of two opposing edges of the main panel; and
a cover plate covering a front surface of the main panel and the auxiliary panel, the cover plate is made of tempered glass having high transmittance which is adhered onto the main panel and the auxiliary panel by a transparent adhesive sheet,
wherein the auxiliary panel has a curved shape.

2. The display device of claim 1, wherein
the main panel has a flat shape.

3. The display device of claim 2, wherein
the cover plate includes a main region covering the main panel and an auxiliary region covering the auxiliary panel,
the main region has the flat shape, and the auxiliary region has the curved shape.

4. The display device of claim 2, wherein
the main panel is made of a liquid crystal panel or an organic light emitting panel.

5. The display device of claim 4, wherein
the liquid crystal panel includes:
a substrate;
a thin film transistor positioned on the substrate;
a pixel electrode connected to the thin film transistor;
a roof layer positioned to be separated from the pixel electrode via a plurality of microcavities on the pixel electrode;
a liquid crystal layer filling the microcavities; and
an overcoat positioned on the roof layer and sealing the microcavities.

6. The display device of claim 4, wherein
the auxiliary panel is formed of at least one of the liquid crystal panel, the organic light emitting panel, and a light emitting diode (LED) panel.

7. The display device of claim 2, wherein
the main panel and the auxiliary panel are integrally formed.

8. The display device of claim 1, wherein
the main panel has the curved shape.

9. The display device of claim 8, wherein
a bending direction of the main panel and a bending direction of the auxiliary panel are different.

10. The display device of claim 9, wherein
the main panel has the concave curved surface in a front view, and the auxiliary panel has the convex curved surface in a front view.

11. The display device of claim 9, wherein
the cover plate includes a main region covering the main panel and an auxiliary region covering the auxiliary panel, and the main region and the auxiliary region have the curved shape.

12. The display device of claim 11, wherein the bending direction of the main region and the bending direction of the auxiliary region are different.

13. The display device of claim 12, wherein the main region has the concave curved surface in a front view, and the auxiliary region has the convex curved surface in a front view.

14. The display device of claim 9, wherein the main panel is formed of a liquid crystal panel or an organic light emitting panel.

15. The display device of claim 14, wherein the liquid crystal panel includes:
a substrate;
a thin film transistor positioned on the substrate;
a pixel electrode connected to the thin film transistor;
a roof layer positioned to be separated from the pixel electrode via a plurality of microcavities on the pixel electrode;
a liquid crystal layer filling the microcavities; and
an overcoat positioned on the roof layer and sealing the microcavities.

16. The display device of claim 14, wherein the auxiliary panel is formed of at least one of the liquid crystal panel, the organic light emitting panel, and a light emitting diode (LED) panel.

17. The display device of claim 9, wherein the main panel and the auxiliary panel are integrally formed.

18. The display device of claim 1, wherein the display device is used as a TV.

19. The display device of claim 18, wherein the auxiliary panel displays at least one among a channel, a volume, a subtitle, an e-mail, an Internet icon, and a biorhythm, or is used as a lamp.

* * * * *